US007599501B2

(12) United States Patent
Sferrazza et al.

(10) Patent No.: US 7,599,501 B2

(45) Date of Patent: Oct. 6, 2009

(54) SINGLE BIT PER-VOICE DRY/WET REVERB CONTROL

(75) Inventors: Ben Sferrazza, Sunnyvale, CA (US); David Lin, San Jose, CA (US)

(73) Assignee: LSI Corporation, Milpitas, CA (US)

( * ) Notice: Subject to any disclaimer, the term of this patent is extended or adjusted under 35 U.S.C. 154(b) by 1025 days.

(21) Appl. No.: 10/903,069

(22) Filed: Jul. 30, 2004

(65) Prior Publication Data

US 2006/0023894 A1 Feb. 2, 2006

(51) Int. Cl.
*H03G 3/00* (2006.01)
*G10H 1/02* (2006.01)

(52) U.S. Cl. .......................................... 381/63; 84/630

(58) Field of Classification Search .................. 84/707, 84/630, DIG. 26; 381/63, 61, 118; 700/94
See application file for complete search history.

(56) References Cited

U.S. PATENT DOCUMENTS 3,565,996 A * 2/1971 Suzuki ........................ 84/707
4,352,954 A * 10/1982 Franssen et al. ............... 381/63
4,472,993 A * 9/1984 Futamase et al. .............. 84/629
5,978,492 A * 11/1999 Furuhashi .................. 381/119
6,901,149 B2 * 5/2005 Suruga ...................... 381/119

* cited by examiner

*Primary Examiner*—Vivian Chin
*Assistant Examiner*—Kile Blair
(74) *Attorney, Agent, or Firm*—William W. Cochran; Cochran Freund & Young LLC

(57) ABSTRACT

A dry/wet bit for controlling dry and wet components of an output sound during processing of an input sound is provided. The bit is configurable by a program to indicate when to reverse the dry and wet components of the output sound. When the bit has a first value, the dry component is calculated by modifying the input sound by an attenuation factor, and the wet component is calculated by providing to a reverberation filter as input the dry component modified by a reverberation factor. When the bit has a second value, the wet component is calculated by providing to the reverberation filter as input the input sound modified by the attenuation factor, and the dry component is calculated by modifying the input to the reverberation filter by the reverberation factor.

27 Claims, 2 Drawing Sheets

| Bit Value | Dry | Wet |
|---|---|---|
| 0 | Original * Gain | Original * Gain * ReverbFactor |
| 1 | Original * Gain * ReverbFactor | Original * Gain |

| Bit Value | Dry | Wet |
|---|---|---|
| 0 | Original * Gain | Original * Gain * ReverbFactor |
| 1 | Original * Gain * ReverbFactor | Original * Gain |

FIG. 1

SINGLE BIT PER-VOICE DRY/WET REVERB CONTROL

FIELD OF THE INVENTION

The present invention relates to sound processing, and more particularly to a method for controlling direct and reverberation components of a sound.

BACKGROUND OF THE INVENTION

In reverberation environments, a listener will perceive the sound directly from the sound source and reflections of this sound off of objects in that environment. In most scenarios, the total sound heard will include a direct (non-reverberated) component and a reverberated component. Rarely, will there only be a direct sound or only a reverberated sound.

In many cases, the original sound is stored at its maximum amplitude (quantized to 16-bits in the case of the CD standard 16-bits PCM). As part of the original sound's processing, it is multiplied by gain controls in the form of volume or gain envelopes that only range in value from 0 to 1 and therefore act as an attenuation factor. The attenuation factor only reduces the sound, since amplification of the original sound could result in overflow. Not only is this overflow not desired, restricting the gain controls to only be able to attenuate simplifies the hardware. In such hardware, a reverberation factor is applied to this gain modified version of the original sound to control its contribution to a reverberation filter. The input data into the reverberation filter can therefore be expressed as the equation:

INPUT TO REVERB FILTER=(ORIGINAL SOUND*GAIN)*REVERB FACTOR

Thus, the input to the reverberation filter is necessarily a second attenuated version of the original sound, assuming the reverberation factor is also restricted to not being capable of amplification (e.g. values ranging from 0-1).

The gain modified, or first attenuated, version, of the original sound can be thought of as the "dry" component of the sound (realized by the equation: original sound*gain), while the output of the reverberation filter, which is given the second attenuated version (realized by the equation: dry component* reverberation factor) as its input, is referred to as the "wet" component of the sound. In most real-life environments, the reflected sound represented by the wet component will be less than the non-reflected direct sound represented by the dry component. It is desirable, however, to provide the ability to create reverberation environments that contain more wet than dry sound.

Conventional sound processors lack the ability to allow more of a wet sound component than a dry sound component. One possible solution is to allow for a reverberation factor greater than 1, i.e., allow amplification of the dry component, and provide this as input to the reverberation filter. This solution, however, has many flaws. If much more wet sound was wanted over dry sound, and the gain was set very low, the reverb factor would need to be arbitrarily large. Just how large should be allowed is not apparent. In the extreme case where no dry component is wanted, which is achieved by having a 0 gain, no matter how high the reverberation factor, there could be no purely wet sound.

An alternative solution would be to modify the above equation for the input into the reverb filter logic as follows:

INPUT TO REVERB FILTER=ORIGINAL SOUND*REVERB FACTOR

In this solution, the dry and wet components would essentially be modified independently, each with their own gain factor (the dry would be Original*Gain and the wet would be Original*Reverb Factor).

This implementation, however, has several drawbacks. One downside is the extra computation needed by the programmer (whether actually done in software or mentally). For instance, if one wished to control the volume of the original sound, one could set the gain to some factor, say 0.5. Without any reverb, the output sound (purely dry) would be one-half the amplitude of the original sound. If the amount wanted to be given to the reverb filter were one-half of the dry component, the reverb factor would have to be set at 0.25, or one-half of the gain. The disadvantage to this is that a programmer of a sound processing application must be aware of this interdependency between the gain and the reverberation factor when wanting to control the amount of dry and wet sound components. In this respect, conventional sound processing techniques are better because the programmer need not be aware of this interdependency between the gain and reverberation factor when wanting to control the amount of dry and wet sound components. If the programmer wants the amount provided to the reverb filter to be one-half of the dry component, he need only set the reverb factor to one-half.

Another, more significant drawback with the above implementation deals with gain smoothing. In some sound processors that process sound frames having multiple samples each, the gain values can only change at every frame. When a change occurs, the gain at one frame is smoothly transitioned over all the samples to the new gain value of the next frame. If the amount given to the reverberation filter were to be smoothed as well, separate smoothing logic would be needed for both the gain and reverb factor in this implementation.

Accordingly, what is needed is an improved method and system for controlling the dry and wet components of a sound. The present invention addresses such a need.

BRIEF SUMMARY OF THE INVENTION

The present invention provides a dry/wet bit for controlling dry and wet components of an output sound during processing of an input sound. The bit is configurable by a program to indicate when to reverse the dry and wet components of the output sound. When the bit has a first value, the dry component is calculated by modifying the input sound by an attenuation factor, and the wet component is calculated by providing to a reverberation filter as input the dry component modified by a reverberation factor. When the bit has a second value, the wet component is calculated by providing to the reverberation filter as input the input sound modified by the attenuation factor, and the dry component is calculated by modifying the input to the reverberation filter by the reverberation factor.

According to the method and system disclosed herein, single bit solution is provided that allows for full control over the wet and dry components of a sound without any of the limitations or drawbacks inherent in the other proposed implementations. The solution is low cost in terms of both implementation and processing.

BRIEF DESCRIPTION OF SEVERAL VIEWS OF THE DRAWINGS

FIG. 1 is a table illustrating the functionality of a one bit dry/wet bit control in a preferred embodiment of the present invention.

DETAILED DESCRIPTION OF THE INVENTION

Figure 2:
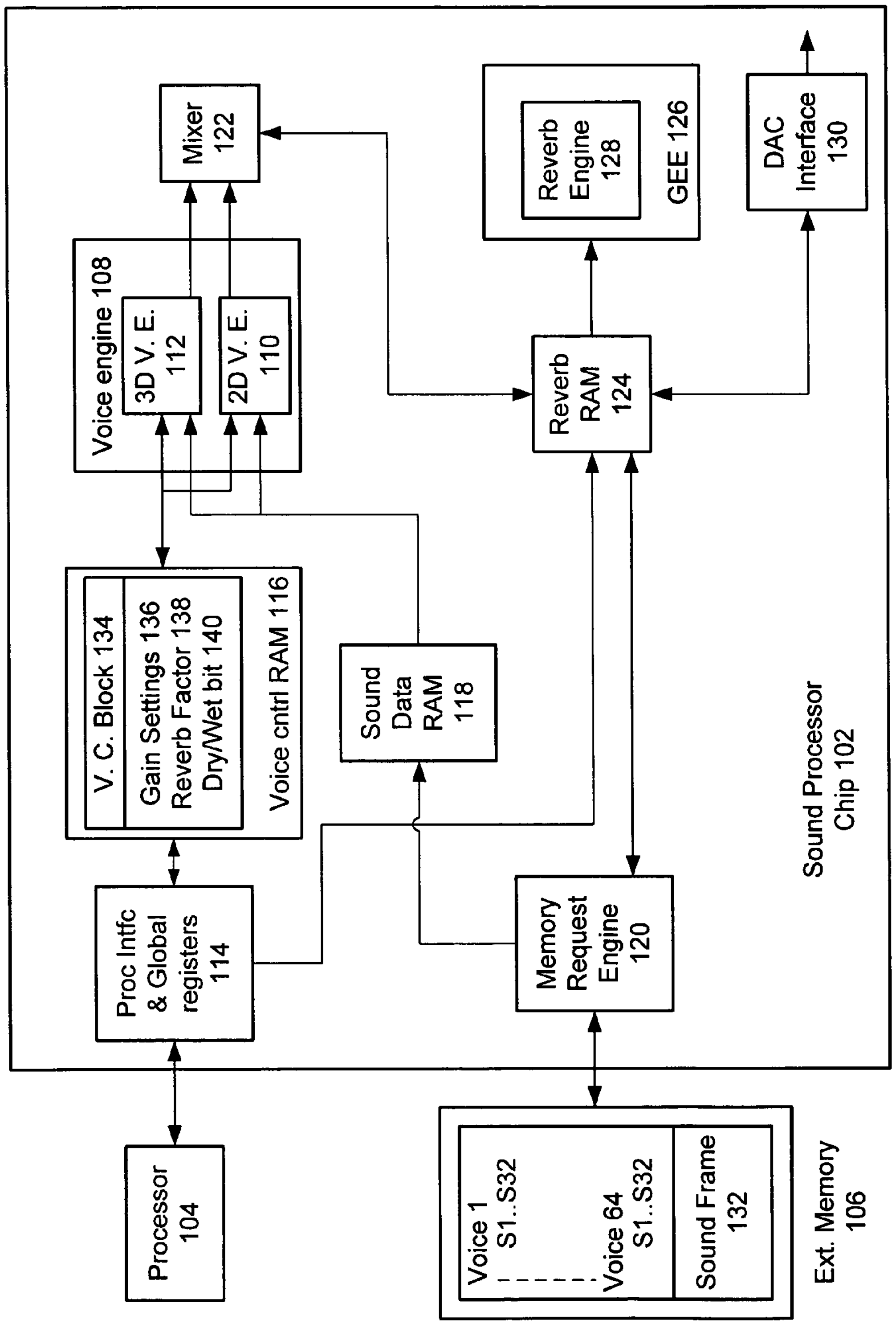
FIG. 2 is a diagram illustrating a sound processing system for implementing the 1-bit dry/wet reverb control in accordance with a preferred embodiment of the present invention.

The present invention relates to dry/wet reverberation control. The following description is presented to enable one of ordinary skill in the art to make and use the invention and is provided in the context of a patent application and its requirements. Various modifications to the preferred embodiments and the generic principles and features described herein will be readily apparent to those skilled in the art. Thus, the present invention is not intended to be limited to the embodiments shown, but is to be accorded the widest scope consistent with the principles and features described herein.

The present invention provides a method and system for controlling the dry and wet components of a sound. In order to support having the reverberation component of a sound be greater than the direct or non-reverberated component, a single dry/wet bit that is independently configurable for every voice (or sound to be mixed into the final output) is provided to enable programs to indicate to a sound processor to reverse equations for calculating the wet and dry components of the sound.

The dry/wet bit instructs the sound processor to use the attenuated value from the equation, Orig. Sound*Gain, as either the dry component or as the wet component. That is, when the dry/wet bit is set to one value, the standard process applies and the first attenuated value is used as the dry component, while the additional reverberation factor applied to the first attenuated value to produce a second attenuated value is used as input to the reverberation filter to ultimately produce the wet component, thereby making the dry component greater than the wet component. When the dry/wet bit is set to a second value, however, the first attenuated value is used as input to the reverberation filter to ultimately produce the wet component, while the second attenuated value is used as the dry component, thereby making the wet component greater than the dry component. This simple and elegant solution allows for full control over the wet and dry components without any of the limitations or drawbacks inherent in the other proposed implementations.

FIG. 1 is a table illustrating the functionality of a one bit dry/wet bit control in a preferred embodiment of the present invention. In the preferred embodiment, the dry/wet bit is considered in the "off" position when it has a value of 0, and is considered in the "on" position when it has the value of 1. In the "off" position, the reverb control provided by the dry/wet bit works as originally specified. The dry amount is simply the original input sound modified by some attenuation factor, e.g., gain. This attenuation factor or gain is smoothed when changed between frames. The amount input to the reverberation filter, which produces the wet component, is simply the dry component attenuated by some amount specified by the reverb factor. Since the gain factor is smoothed when transitioning, the wet component will naturally smooth as well. The "off" state of this 1-bit dry/wet reverb control would be used when more dry sound is desired over wet sound in the final output. A purely dry sound would correspond to setting the reverberation factor to 0.

In the "on" position, the equations for calculating the dry component and the amount input to the reverberation logic are swapped. In this scenario, the amount input to the reverberation filter for producing the wet component is the original input sound modified by the gain. The gain would be smoothed when changing values between frames. The dry component is calculated by further attenuating the input to the reverberation filter by the reverb factor. Again, since the gain factor is smoothed when determining the amount given as input to the reverb filter logic, the dry component will naturally smooth as well. The "on" state of the 1-bit dry/wet reverb control would be used when more wet sound is desired over dry sound in the final output. A purely wet sound would correspond to setting the reverb factor to 0.

A small limitation of this implementation is that the non-dominant factor (wet in the "off" state, dry in the "on" state) cannot smoothly transition independent of the dominant factor. The reverb factor only acts as a constant that is multiplied against the smoothed gain value. If the facility to independently transition the non-dominant factor is desired, the target transition value and a rate to specify how the transition should be carried out would need to be included for each voice as is already done in the case of gain transitions. In addition to this requirement, current transition values would need to be stored to keep track of the progress of the transition and extra computation would be needed to calculate the non-dominant smoothed transition values. The 1-bit control implementation provided by the dry/wet bit is elegant and low-cost, which more than makes up for the aforementioned limitation that would likely not even be necessary.

FIG. 2 is a diagram illustrating a sound processing system for implementing the 1-bit dry/wet reverb control in accordance with a preferred embodiment of the present invention. The sound processing system 100 includes a sound processor chip 102 that interacts with an external processor 104 and external memory 106. The sound processor chip 102 includes a voice engine 108, which optionally includes separate 2-D and 3-D voice engines 110 and 112, a processor interface and global registers 114, a voice control RAM 116, a sound data RAM 118, a memory request engine 120, a mixer 122, a reverberation RAM 124, a global effects engine 126, which includes a reverberation engine 128, and a digital-to-analog converter (DAC) interface 130.

Sound is input to the sound processor chip 102 from the external memory 106 as a series of sound frames 132. Each sound frame 132 comprises sixty-four voices, and each voice includes thirty-two samples. The voice engine 108 processes each of the sixty-four voices of a frame 132 one at a time. A voice control block 134 stored in the voice control RAM 116 stores the settings that specify how the voice engine 108 is to process each of the sixty-four voices. The voice engine 108 begins by reading the voice control block 134 to determine the location of the input sound and sends a request to the memory request engine 120 to fetch the thirty-two samples of the voice being processed. The thirty-two samples are then stored in the sound data RAM 118 and processed by the voice engine 108 according to the contents of the corresponding control block 134.

The settings stored in the voice control block 134 include gain settings 136, the reverberation factor 138, and the dry/wet bit 140 of the present invention. The gain settings 136 may include left/right volumes, a gain envelope, and an optional low frequency oscillator (LFO), which is a periodic function that can be applied to the gain to vary it periodically, effect the overall gain. The overall gain, of which there is one for both the left and right channel, will be a value that ranges from 0 to 1, where 0 suppresses the output sound completely and 1 leaves it unaffected. Any intermediary value attenuates the sound. The input sound is monophonic, so applying the left gain factor to the input sound produces an attenuated left channel, and applying the right gain factor to the input sound produces an attenuated right channel. Under normal circumstances, each input sound sample has the gain values applied to it to produce separate left and right samples.

During processing of the sound, the contents of the control block 134 may be altered by a high-level program (not shown) running on the processor 104. The processor interface 114 accepts the commands from processor, which are first typically translated down to AHB bus protocol. According to the present invention, the program may now be configured to issue commands to change the wet/dry bit 140 in the voice control block 134 in order to control the dry/wet components of the sound.

The voice engine 108 reads the values from the control block 134 and applies the gain and reverberation factors 136 and 138 using the equations described above, producing the first attenuated value and the second attenuated value for both channels. These values are then sent to the mixer 122. The mixer 122 maintains different banks of memory in the reverb RAM 124, including a 2-D bank, a 3-D bank and a reverb bank (not shown). Depending on the setting of the dry/wet bit 140, the attenuated values and the second attenuated values are stored in these different memory banks. For example, when the dry/wet bit 140 is 0, the mixer 122 mixes the first attenuated values for the left and right channels with the values for existing samples from other voices by temporarily storing the values in the 2-D and 3-D banks of the reverb RAM 124. The mixer 122 stores the second attenuated values in the reverb bank of the reverb RAM 124. After all the samples are processed for a particular voice, the global effects engine 126 inputs the data from the reverb bank of the reverb RAM 124 to the reverb engine 128.

The reverb engine 128 is a filter that includes delaying the data to model reflections of the direct sound in a reverberation environment and outputs reverberated data as the wet component. The global effects engine 126 mixes the reverberated data with the data from the 2-D and 3-D banks, the dry component, to produce the final output. This final output is input to the DAC interface 130 for output to a DAC to deliver the final output as audible sound.

As can be seen, the data sent to the mixer 122 by the voice engine 108 to be used by the reverb engine 128 is further attenuated, so it can never be greater than the non-reverberated content. The wet/dry bit 140 can be set to dynamically instruct the voice engine 108 to swap what is given to the mixer 122 as direct (dry) component and what is given to the mixer 122 for input to the reverb engine 128 to produce the wet component. With the wet/dry bit 140, what is considered the wet component can now be greater than the dry component in the final output.

A method and system for controlling the dry/wet component of a sound has been disclosed. The present invention has been described in accordance with the embodiments shown, and one of ordinary skill in the art will readily recognize that there could be variations to the embodiments, and any variations would be within the spirit and scope of the present invention. Accordingly, many modifications may be made by one of ordinary skill in the art without departing from the spirit and scope of the appended claims.

We claim:

1. A method for controlling a sound processor, comprising:

receiving and storing, in a memory element, a bit configurable by a program that indicates when to reverse a dry component and a wet component of an output sound;

based on the bit having a first value, configuring the sound processor to calculate the dry component by modifying an input sound by an attenuation factor, and calculate the wet component by providing to a reverberation filter as input the dry component modified by a reverberation factor; and based on the bit having a second value, configuring the sound processor to calculate the wet component by providing to the reverberation filter as input the input sound modified by the attenuation factor, and calculate the dry component by modifying the input to the reverberation filter by the reverberation factor.

2. The method of claim 1 further comprising: providing the bit with the first value when more dry sound is desired over wet sound in a final output.

3. The method of claim 2 further comprising: providing the bit with the second value when more wet sound is desired over dry sound in the output sound.

4. The method of claim 3 further comprising: modifying the sound by multiplying the sound by a gain.

5. The method of claim 4 further comprising: smoothing a gain factor when the gain is changed between frames.

6. The method of claim 1 further comprising: setting the bit to a 0 to represent an off position in which the calculations for the dry and wet components are not switched.

7. The method of claim 6 further comprising: setting the bit to a 1 to represent an on position in which the calculations for the dry and wet components are switched.

8. A system for producing a dry component and a wet component of a sound in a sound processor, comprising:

a bit, stored in a memory element, that is configurable by a program to indicate when to reverse the dry and wet components of the sound;

a voice engine that, in response to the bit having a first value calculates the dry component by modifying the input sound by an attenuation factor, and calculates the wet component by causing the dry component modified by a reverberation factor to be provided as input to a reverberation filter and, in response to the bit having a second value calculates the wet component by causing the input sound modified by the attenuation factor to be provided as input to the reverberation filter, and calculates the dry component by modifying the input to the reverberation filter by the reverberation factor.

9. The system of claim 8 wherein the bit is included in settings that specify which calculations a voice engine is to use when processing a plurality of voices in the sound.

10. The system of claim 9 wherein the settings are stored in a voice control block.

11. The system of claim 10 wherein the voice control block is stored in a voice control RAM that is accessed by the voice engine.

12. The system of claim 11 wherein the voice engine and voice control RAM are implemented on a sound processor chip.

13. The system of claim 12 wherein the program capable of changing the settings in the voice control block executes on a processor external to the sound processor chip.

14. The system of claim 13 wherein the reverberation filter is included in an effects engine.

15. The system of claim 14 wherein the effects engine adds the dry component and the wet component to produce the output sound.

16. The system of claim 8 wherein the bit is provided with the first value when more dry sound is desired over wet sound in the output sound.

17. The system of claim 16 wherein the bit is provided with the second value when more wet sound is desired over dry sound in the final output sound.

18. The system of claim 8 the sound is modified by multiplying the sound by a gain.

19. The system of claim 8 wherein a gain factor is smoothed when the gain is changed between frames.

20. The system of claim 8 wherein the bit is set to a 0 to represent an off position in which calculations for the dry and wet components are not switched.

21. The system of claim 20 wherein the bit is set to a 1 to represent an on position in which calculations for the dry and wet components are switched.

22. A method for controlling a dry component and a wet component of an output sound in a sound processor utilizing a first equation for applying a direct sound gain to an input sound to produce a first attenuated value, and a second equation for applying a reverberation factor to the first attenuated value to produce a second attenuated value, the method comprising:

receiving and storing, in a memory element, a dry/wet bit that is configurable by a program to indicate to the sound processor when to reverse the first and second equations for calculating dry and wet components;

in response to the sound processor reading a first value from the dry/wet bit, configuring the sound processor to use the first attenuated value as the dry component and using the second attenuated value as at least a portion of the wet component, thereby making the dry component greater than the wet component; and in response to the sound processor reading a second value from the dry/wet bit, configuring the sound processor to use the first attenuated value as at least a portion of the wet component, and using the second attenuated value as the dry component, thereby making the wet component greater than the dry component.

23. The method of claim 22 further comprising: providing the dry/wet bit with the first value when more dry sound is desired over wet sound in a final output.

24. The method of claim 23 further comprising: providing the dry/wet bit with the second value when more wet sound is desired over dry sound in the final output.

25. The method of claim 24 further comprising: smoothing a gain factor when the gain is changed between frames.

26. The method of claim 22 further comprising: setting the dry/wet bit to a 0 to represent an off position in which the second attenuated value is input to a reverberation filter to produce the wet component.

27. The method of claim 22 further comprising: setting the dry/wet bit to a 1 to represent an on position in which the first attenuated value is input to a reverberation filter to produce the wet component.

* * * * *